United States Patent
Saito

[19]

[11] Patent Number: 5,770,975
[45] Date of Patent: Jun. 23, 1998

[54] PHASE-LOCKED LOOP CIRCUIT HAVING A HIGH-SPEED FORCIBLE PULLING-IN FUNCTION

[75] Inventor: Toshio Saito, Tokyo, Japan

[73] Assignee: NEC Corporation, Tokyo, Japan

[21] Appl. No.: 788,654

[22] Filed: Jan. 24, 1997

[30] Foreign Application Priority Data

Jan. 24, 1996 [JP] Japan ................................. 8-009840

[51] Int. Cl.⁶ ............................................. H03L 7/00
[52] U.S. Cl. .............................. 331/1 R; 331/8; 331/17; 331/25; 331/34; 331/36 R
[58] Field of Search ............................ 331/1 R, 8, 17, 331/25, 34, 36 R

[56] References Cited

U.S. PATENT DOCUMENTS

| | | | |
|---|---|---|---|
| 5,136,260 | 8/1992 | Yousefi-Elezei | 331/17 |
| 5,170,135 | 12/1992 | Ito et al. | 331/17 |
| 5,550,515 | 8/1996 | Liang et al. | 331/17 |

*Primary Examiner*—David C. Nelms
*Assistant Examiner*—Trong Phan
*Attorney, Agent, or Firm*—Scully, Scott, Murphy & Presser

[57] ABSTRACT

The phase-locked loop circuit provided by the present invention has a voltage-controlled oscillating circuit that has a nonlinear characteristic representing the relation between the control voltage applied to the voltage-controlled oscillating circuit and the frequency of a signal generated thereby. With a voltage lower than a predetermined voltage V1 applied to the voltage-controlled oscillating circuit, the rate of change in frequency with a change in control voltage applied to the voltage-controlled oscillating circuit is high. As a result, the loop gain of the phase-locked loop circuit can be changed at a high speed. The phase-locked loop circuit is designed so that, when a forcible pulling-in operation is started after the phase locked state is lost due to removal of an input signal, the control voltage applied to the voltage-controlled oscillating circuit is set at a low potential from the beginning in order to increase the loop gain. As the voltage-controlled oscillating circuit has entered the forcible pulling-in operation, the forcible pulling-in operation can thus be completed in a short time. As a result, in comparison with the conventional forcible pulling-in time shortening method based on switching of the time constant of a loop filter, the changing of the frequency during the switching time can be accelerated because no device for switching of the time constant is required and, on the top of that, the stability of the forcible pulling-in operation can be enhanced.

5 Claims, 3 Drawing Sheets

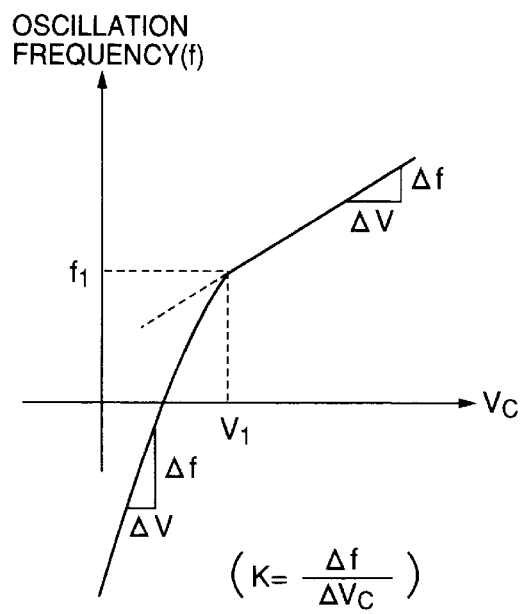
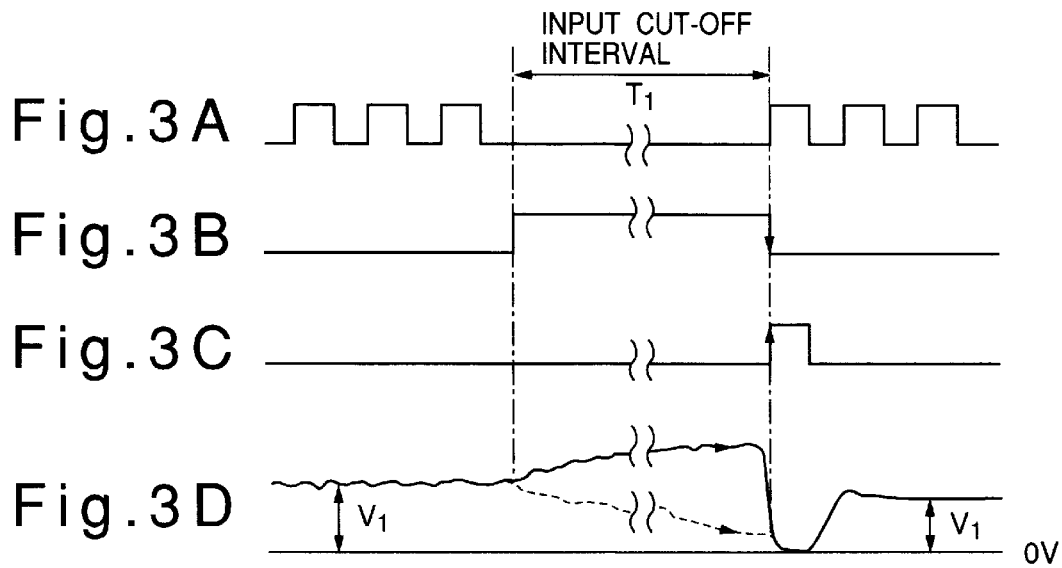

PHASE-LOCKED LOOP CIRCUIT HAVING A HIGH-SPEED FORCIBLE PULLING-IN FUNCTION

BACKGROUND OF THE INVENTION

1. Field of the Invention

The present invention, in general, relates to a phase-locked loop circuit (PLL) and, in particular, relates to a PLL that can carry out a phase forcible pulling-in operation at a high speed.

2. Description of the Related Art

A circuit disclosed in Japanese Patent Laid-open No. Sho 57-141137 is known as a conventional PLL that can carry out a phase forcible pulling-in operation at a high speed. In the circuit disclosed in this document, a loop characteristic is changed by switching the time constant of a loop filter of a phase control loop so that the time constant in a forcible pulling-in operation is greater than the time constant in a steady-state operation.

However, the method of switching the time constant of a loop filter has a shortcoming that the forcible pulling-in operation becomes unstable due to effects of noise and the like generated by a switching device in the switching operation. In addition, the method also has another shortcoming that jitters are generated in an output signal in a loop forcible pulling-in operation.

SUMMARY OF THE INVENTION

The present invention addresses the shortcomings encountered in the conventional technology. It is thus an object of the present invention to provide a phase-locked loop circuit with a high-speed forcible pulling-in function which stabilizes a forcible pulling-in operation and prevents jitters from being generated in the output signal during a forcible pulling-in operation.

The phase-locked loop circuit provided by the present invention comprises a voltage-controlled oscillating circuit (VCO) and a phase comparator for comparing the phase of a signal output by the voltage-controlled oscillating circuit with the phase of an input signal.

A predetermined control voltage causes the VCO to generate a signal at a center oscillation frequency. In a first control voltage region, the oscillation frequencies are lower than the center oscillation frequency. In a second control voltage region, on the other hand, the oscillation frequencies are higher than the center oscillation frequency. The VCO is designed so that the control sensitivity in the first control voltage region is higher than that in the second control voltage region.

In addition, the phase-locked loop circuit also has a control-voltage setting circuit for forcibly setting the control voltage applied to the VCO at a predetermined value in the first control voltage region in a transition of the input signal thereof from a cut-off state to a supplied state.

According to the present invention, the switching of the time constant of the loop filter by means of a switching device is not carried out. Instead, the voltage-controlled oscillating circuit is designed so that the control sensitivity thereof is variable. To be more specific, at a forcible pulling-in time, the control sensitivity is increased to speed up the forcible pulling-in operation. At a steady-state time, on the other hand, the control sensitivity is decreased to stabilize the operation.

As a result, the characteristic of the voltage-controlled oscillating circuit representing the relation between the control voltage and the oscillation frequency is not a straight line. Instead, the gradient of the characteristic curve in the region below the center frequency is great, indicating a high control sensitivity. Thus, at a forcible pulling-in time, the voltage-controlled oscillating circuit operates in the region in which the control sensitivity is high. As a result, the loop band is wide, making a stable high-speed forcible pulling-in operation possible.

BRIEF DESCRIPTION OF THE DRAWINGS

The above and other objects, features as well as many of attendant advantages of the present invention will become apparent from the following detailed description when considered with reference to the accompanying drawings wherein:

FIG. 2 is a diagram showing a typical characteristic of a VCO employed in the phase-locked oscillating circuit shown in FIG. 1;

FIGS. 3A to 3D are diagrams showing waveforms generated during the operation of the phase-locked oscillating circuit shown in FIG. 1;

It should be noted that, throughout the drawings, identical reference numerals and notations are used to denote the same structural elements.

DETAILED DESCRIPTION OF THE PREFERRED EMBODIMENT

The present invention will become more apparent from the following detailed description of preferred embodiments with reference to the accompanying diagrams showing the embodiments.

Figure 1:
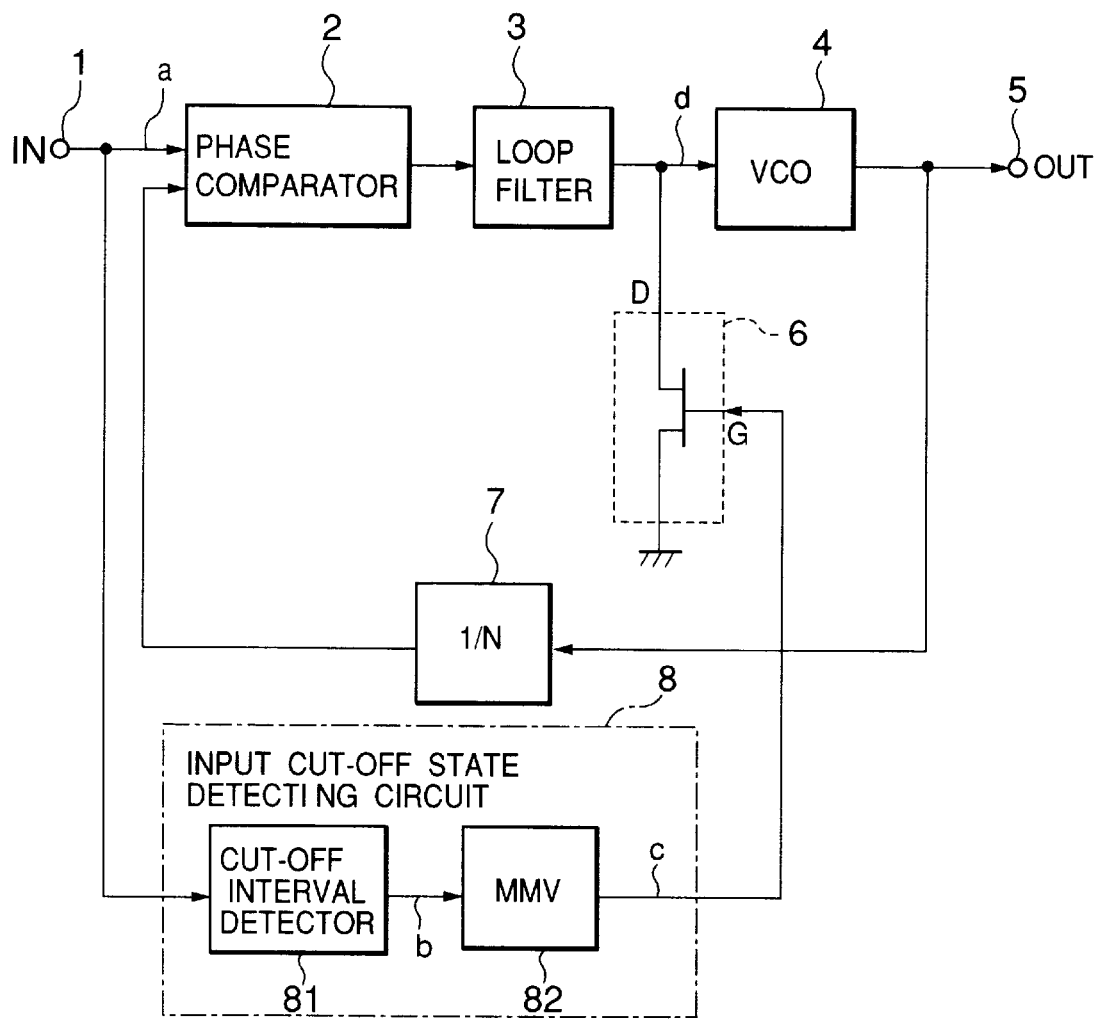
FIG. 1 is a block diagram showing a phase-locked oscillating circuit provided by an embodiment of the present invention.

As shown in FIG. 1, an external input signal (a) is supplied to one of the inputs of a phase comparator 2. A signal output by a voltage-controlled oscillating circuit (VCO) 4 is supplied to a variable-denominator frequency divider 7 for appropriately dividing the frequency of the output signal. A signal output by the variable-denominator frequency divider 7 is supplied to the other input of the phase comparator 2 which outputs a signal representing the difference in phase between the external input signal (a) and the signal output by the voltage-controlled oscillating circuit 4.

The signal representing the difference in phase is supplied to a loop filter 3, a signal output by which is integrated by an integrator. A signal output by the integrator is supplied to the VCO 4 as a control input voltage d.

The control input voltage (d) supplied to the voltage-controlled oscillating circuit 4 is connected to the drain (D) of a FET 6 which is used as a switching device. When the FET 6 is in a conductive state, the control input voltage (d) is connected to the ground by way of the drain (D) and the source (S) of the FET 6. The gate (G) of the FET 6 is controlled by a signal output by a signal input cut-off state detecting circuit 8. In this way, the control input voltage (d) can be set at the ground potential forcibly by the signal input cut-off state detecting circuit 8.

The signal input cut-off state detecting circuit 8 comprises a cut-off interval detector 81 for detecting the cut-off state of the external input signal (a) and generating an interval detection signal (b) accordingly, and an MMV (monostable multivibrator) 82 for generating a fixed-width pulse signal (c) when triggered by the trailing edge of the interval detection signal (b) at the end thereof. The pulse signal (c) generated by the MMV 82 is used as the control signal of the gate (G) of the FET 6.

FIG. 2 is a diagram showing a typical characteristic of the voltage-controlled oscillating circuit 4 shown in FIG. 1. The characteristic represents the relation between the control voltage (Vc) applied to the voltage-controlled oscillating circuit 4 and the oscillation frequency (f) of a signal generated thereby. A predetermined control voltage V1 causes the voltage-controlled oscillating circuit 4 to generate a signal at a center oscillation frequency (f1). A first control voltage region (Vc<V1), is a region in which the oscillation frequencies are lower than the center oscillation frequency. On the other hand, a second control voltage region (Vc≧V1) is a region in which the oscillation frequencies are higher than the center oscillation frequency. The voltage-controlled oscillating circuit 4 is designed so that the control sensitivity K (=Δf/ΔVc) in the first control voltage region is higher than that in the second control voltage region.

FIGS. 3A to 3D are diagrams showing waveforms generated during the operation of the phase-locked loop circuit shown in FIG. 1. To be more specific, FIGS. 3A to 3D are diagrams showing the waveforms of the signals (a) to (d) of the phase-locked loop circuit shown in FIG. 1 respectively.

When the external input signal (a) enters a cut-off interval T1 as shown in FIG. 3A, the cut-off interval detector 81 asserts the interval detection signal (b) during the interval T1 as shown in FIG. 3B. At the end of the cut-off interval T1, the MMV 82 is triggered by the trailing edge of the interval detection signal (b), generating a fixed-width pulse signal (c) as shown in FIG. 3C.

The fixed-width pulse signal (c) turns on the FET 6. With the FET 6 turned on, the control input voltage (d) supplied to the voltage-controlled oscillating circuit 4 is forcibly pulled down to the ground voltage (or the lowest voltage) of the phase-locked loop circuit as shown in FIG. 3D. As a result, the oscillation frequency of the voltage-controlled oscillating circuit 4 jumps to a value smaller than the frequency f1 generated by the control voltage V1 at a steady-state time and, at the same time, the control sensitivity K changes to a large value.

The loop of the phase-locked loop circuit shown in FIG. 1 comprises the phase comparator 2, the loop filter 3 and the voltage-controlled oscillating circuit 4. Thus, the loop band of the phase-locked loop circuit is given by the product PKH where notation P is the sensitivity of the phase comparator 2, notation K is the control sensitivity of the voltage-controlled oscillating circuit 4 and notation H is the time constant of the loop filter 3.

Accordingly, by switching the control sensitivity K of the voltage-controlled oscillating circuit 4 to a value greater than that of the steady-state operation, the loop band is increased. As a result, the loop gain is increased, improving the forcible pulling-in characteristic.

During the subsequent forcible pulling-in process, the control sensitivity K automatically transits to the value of the steady-state operation gradually, lowering the loop gain as well. After the phase-locked loop circuit has been pulled in to a stable state, the loop gain is changed back to a small value and the loop band is also narrowed. As a result, the generation of jitters and the like by the PLL (Phase-Locked Loop) is suppressed.

It should be noted that, in FIG. 3D, the control input voltage (d) is shown in two ways during the interval T1: by solid and dotted lines. Depending upon how the loop filter 3 is configured, the control input voltage (d) output by the loop filter may be shifted to the power-supply side or the ground side as shown by the solid or dotted line, respectively.

Figure 4:
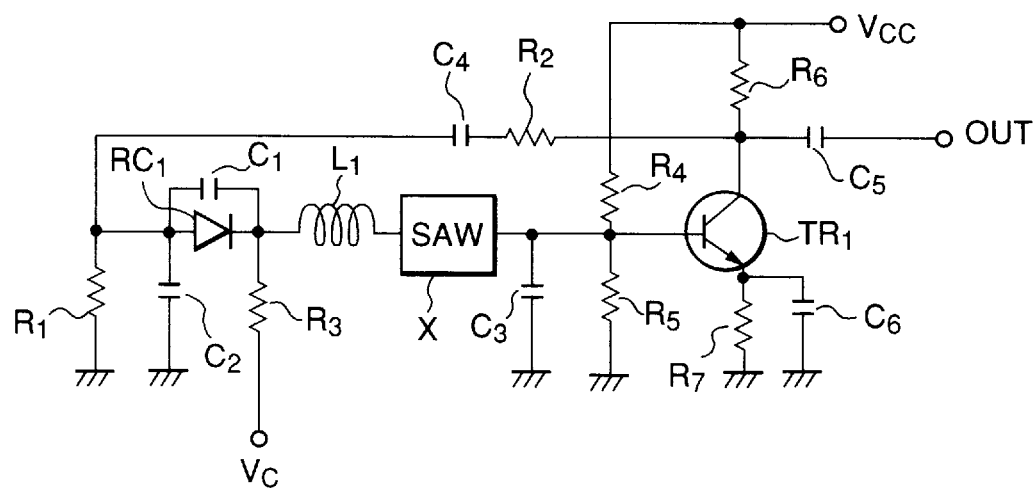
FIG. 4 is a circuit diagram showing details of the VCO employed in the phase-locked oscillating circuit shown in FIG. 1.
Figure 5:
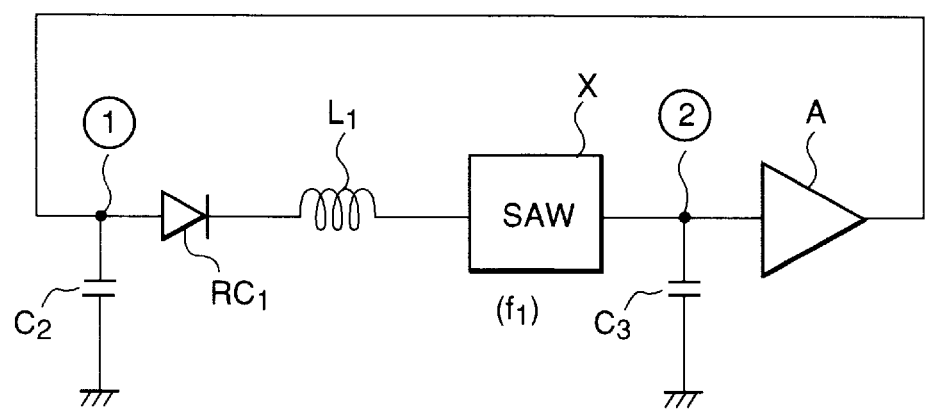
FIG. 5 is a diagram showing an equivalent circuit of the VCO shown in FIG. 4.

FIG. 4 is a circuit diagram showing a typical voltage-controlled oscillating circuit and FIG. 5 is a diagram showing an equivalent circuit thereof. As shown in FIG. 5, basically, the voltage-controlled oscillating circuit 4 is a Colpitts oscillating circuit comprising capacitive elements C2 and C3, a coil L1, a SAW (Surface Acoustic Wave) resonance element X and a variable-capacitance diode RC1 which allows the voltage-controlled oscillating circuit 4 to operate at a variable frequency.

The capacitors C2 and C3 are connected to the ends of a series circuit comprising the variable-capacitance diode RC1, the coil L1 and the SAW resonance element X. The other ends of the capacitors C2 and C3 are connected to the ground.

The control voltage Vc is applied to a circuit comprising a resistor R3, the variable-capacitance diode RC1 and the resistor R1. The voltage-controlled oscillating circuit 4 also includes a transistor TR1 which is used as an inverting amplifier. An inverted signal output by the transistor TR1 is positively fed back by way of a feedback circuit comprising a capacitor C4 and a resistor R2.

It should be noted that resistors R4 to R7 and capacitors C1, C5 and C6 are bias resistors and bias capacitors of the transistor TR1, respectively.

The voltage-controlled oscillating circuit 4 is explained through the equivalent circuit shown in FIG. 5. The explanation begins with an operation in a frequency band lower than the resonance frequency f1 of the SAW resonance element X. In this frequency band, a resonance circuit comprising capacitive and inductive elements is formed. The capacitive elements are the variable-capacitance diode RC1, the capacitors C2 and C3 and the capacitive reactance part of the SAW resonance element X while the inductive element is the coil L1. The resonance frequency is determined by the resonance circuit. In this case, the difference in phase between terminals ① and ② is 180 degrees.

In this frequency band, the quality factor Q of the circuit is all but determined by the coil L1. By changing the capacitance of the variable-capacitance diode RC1, the difference in phase between terminals ① and ② and, thus, the resonance frequency can be varied.

Next, an operation in a frequency range in close proximity to the resonance frequency f1 of the SAW resonance element X is explained. The impedance of the SAW resonance element X is the resistance of an infinitesimal pure resistor and the quality factor Q of the SAW resonance element X itself is high. Accordingly, the change in phase occurring in a frequency range in close proximity to the resonance frequency f1 is abrupt enough to cause a change in phase caused by the change in RC1 capacitance to appear to be small. As a result, a change in resonance frequency which occurs when the capacitance of the variable-capacitance diode RC1 is varied is smaller than the change in resonance frequency occurring in a frequency band lower than the resonance frequency f1 described above. It should be noted that the change in frequency indicates the control sensitivity K of the voltage-controlled oscillating circuit.

Putting the facts described above together results in a characteristic, which represents the relation between the control voltage applied to the voltage-controlled oscillating circuit and the frequency of the signal generated by the voltage-controlled oscillating circuit of FIGS. 4 and 5, like the one shown in FIG. 2. As shown in FIG. 2, the voltage-controlled oscillating circuit presents a characteristic which indicates that, in a frequency range in close proximity to the center frequency f1 (that is, the resonance frequency of the SAW resonance element X), the control sensitivity K changes all but gradually.

It should be noted that, while the present invention has been described with reference to certain illustrative embodiments, the description is not intended to be construed in a limiting sense. That is to say, it is to be understood that the subject matter encompassed by the present invention is not limited to those preferred specific embodiments. On the contrary, it is intended for the subject matter encompassed by the present invention to include all alternatives, modifications and equivalents of the preferred embodiments which will be apparent to persons skilled in the art upon reference to the description. It is therefore contemplated that the following appended claims will cover any such alternatives, modifications and equivalents as fall within the true spirit and the scope of the present invention.

What is claimed is:

1. A phase-locked loop circuit comprising a voltage-controlled oscillating circuit and a phase comparator for comparing the phase of a signal output by said phase-locked loop circuit with the phase of an input signal wherein a signal output provided to said voltage-controlled oscillating circuit by said phase comparator is used as a control voltage for controlling said phase-locked loop circuit so that said signal output by said phase-locked loop circuit has a phase synchronized with the phase of said input signal, said phase-locked loop circuit characterized in that:

said voltage-controlled oscillation circuit is designed so that a predetermined control voltage causes said voltage-controlled oscillation circuit to generate a center oscillation frequency and a control sensitivity in a first control voltage region is higher than that in a second control voltage region wherein said first control voltage region is a region for generating oscillation frequencies lower than said center oscillation frequency whereas said second control voltage region is a region for generating oscillation frequencies higher than said center oscillation frequency; and a control-voltage setting circuit which receives said input signal and forcibly sets said control voltage at a predetermined value in said first control voltage region in a transition of said input signal thereof from a cut-off state to a supplied state.

2. A phase-locked loop circuit according to claim 1 wherein said voltage-controlled oscillating circuit comprises:

a series circuit comprising a variable-capacitance element with a capacitance changeable by said control voltage, a coil and a resonance element;

a capacitive element connected between an end of said series circuit and a reference potential point;

another capacitive element connected between the other end of said series circuit and said reference potential point; and a feedback circuit for inverting a signal appearing at said end of said series circuit and feeding back said inverted signal to said other end of said series circuit.

3. A phase-locked loop circuit according to claim 2 wherein a resonance frequency of said resonance element is approximately equal to said center oscillation frequency.

4. A phase-locked loop circuit according to claim 1 wherein said control-voltage setting circuit comprises:

detection means for detecting a cut-off state of said input signal and asserting a cut-off state detection signal during a cut-off period of said input signal; and predetermined-voltage generating means which receives said cut-off state detection signal and generates a predetermined voltage at the end of said cut-off state detection signal for a predetermined period of time.

5. A phase-locked loop circuit according to claim 4 wherein said predetermined-voltage generating means has a switch element which is turned on during said predetermined period of time, outputting said predetermined voltage to be used as said control voltage.

* * * * *